(12) United States Patent
Takada et al.

(10) Patent No.: US 10,298,121 B2
(45) Date of Patent: May 21, 2019

(54) VOLTAGE-CURRENT CONVERSION CIRCUIT AND SWITCHING REGULATOR INCLUDING THE SAME

(71) Applicant: SII Semiconductor Corporation, Chiba-shi, Chiba (JP)

(72) Inventors: Kosuke Takada, Chiba (JP); Akihiro Kawano, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/413,850

(22) Filed: Jan. 24, 2017

(65) Prior Publication Data

US 2017/0222548 A1 Aug. 3, 2017

(30) Foreign Application Priority Data

Jan. 29, 2016 (JP) ................................. 2016-016028

(51) Int. Cl.
*G05F 1/56* (2006.01)
*H03K 5/02* (2006.01)
*H02M 3/155* (2006.01)

(52) U.S. Cl.
CPC ............ *H02M 3/155* (2013.01); *G05F 1/561* (2013.01); *H03K 5/023* (2013.01)

(58) Field of Classification Search
CPC ............ H05B 33/0815; H05B 33/0842; H05B 33/0848; H02M 3/155; H02M 3/156; H02M 3/157; H02M 3/33507; H02M 1/08; H02M 1/088; H02M 2001/0009; G05F 1/561; H03K 5/023

See application file for complete search history.

(56) References Cited

U.S. PATENT DOCUMENTS 7,034,514 B2 * 4/2006 Tachibana ................. G05F 3/30
323/313
8,830,405 B2 9/2014 Murakami
2017/0093274 A1 * 3/2017 He ....................... H02M 1/4225

* cited by examiner

*Primary Examiner* — Lincoln D Donovan
*Assistant Examiner* — Diana J. Cheng
(74) *Attorney, Agent, or Firm* — Brinks Gilson & Lione

(57) ABSTRACT

Provided are a switching regulator and a voltage-current conversion circuit configured to shorten a start-up period. The voltage-current conversion circuit includes: a first MOS transistor of a first conductivity type including a gate and a drain connected in common, and a source connected to a first power supply terminal; a first resistor connected between the drain of the first MOS transistor and a second power supply terminal; and a correction current generation unit including a second resistor, and configured to generate, as a correction current, through use of the second resistor, a current corresponding to a current generated when a voltage corresponding to an absolute value of a gate-source voltage of the first MOS transistor is applied to the first resistor. The voltage-current conversion circuit is configured to add the correction current to a current flowing through the first resistor, to thereby generate the conversion current.

4 Claims, 6 Drawing Sheets

VOLTAGE-CURRENT CONVERSION CIRCUIT AND SWITCHING REGULATOR INCLUDING THE SAME

RELATED APPLICATIONS

This application claims priority under 35 U.S.C. § 119 to Japanese Patent Application No. 2016-016028 filed on Jan. 29, 2016, the entire content of which is hereby incorporated by reference.

BACKGROUND OF THE INVENTION

1. Field of the Invention

The present invention relates to a voltage-current conversion circuit and a switching regulator including the voltage-current conversion circuit.

2. Description of the Related Art

FIG. 6 is a circuit diagram for illustrating a related-art voltage-current conversion circuit 500.

The related-art voltage-current conversion circuit 500 includes a ground terminal 501, a power supply terminal 502, an input terminal 510, an error amplifier circuit 550, a resistor 552, an NMOS transistor 551, PMOS transistors 521 and 522, and an output terminal 528.

The error amplifier circuit 550 has a non-inverting input terminal connected to the input terminal 510, an inverting input terminal connected to one end of the resistor 552 and a source of the NMOS transistor 551, and an output connected to a gate of the NMOS transistor 551. Another end of the resistor 552 is connected to the ground terminal 501. The PMOS transistor 521 has a source connected to the power supply terminal 502, and a gate and a drain connected to a drain of the NMOS transistor 551. The PMOS transistor 522 has a source connected to the power supply terminal 502, a gate connected to the gate of the PMOS transistor 521, and a drain connected to the output terminal 528.

In the related-art voltage-current conversion circuit 500, the error amplifier circuit 550, the NMOS transistor 551, and the resistor 552 form a negative feedback circuit, which operates so that a voltage at the one end of the resistor 552 becomes equal to a voltage VIN at the input terminal 510.

As a result, a current I51 on a path of the resistor 552 is expressed by the following Expression (1), where a resistance value of the resistor 552 is represented by R.

$$I51 = \frac{VIN}{R} \quad (1)$$

In this way, according to the related-art voltage-current conversion circuit 500, the input voltage VIN is converted into the current I51, which is proportional to the input voltage VIN. Further, the PMOS transistors 521 and 522 form a current mirror circuit, to thereby output a current I52 proportional to the current I51 from the output terminal 528 (see, for example, Japanese Patent Application Laid-open No. 2012-200134).

The related-art voltage-current conversion circuit 500 as described above has a problem in that a period of time until the current I52 becomes a steady-state value after the voltage VIN is input, that is, a start-up period is long.

The cause of this problem is as follows. In general, an error amplifier circuit includes a phase compensation capacitor, and hence a phase compensation capacitor included inside the error amplifier circuit 550 is required to undergo a charging operation, which affects the start-up period. The phase compensation capacitor inside the error amplifier circuit is a basic circuit component that is publicly known, and therefore illustration thereof in the drawings is omitted.

In FIG. 7, a waveform of the output current I52 of the related-art voltage-current conversion circuit 500 is shown.

When a voltage VIN is applied at a time t0, the phase compensation capacitor begins to be charged, and, as shown in FIG. 7, the output current I52 increases at a constant slope. This slope is inversely proportional to a capacitance value of the above-mentioned phase compensation capacitor. Hence, although a degree of the slope differs depending on how large the capacitance value is, the gradual slope as shown in FIG. 7 is observed.

Therefore, a start-up period Ts5 from the time t0 at which the voltage VIN is input until a time is at which the current I52 becomes the steady-state value is long.

SUMMARY OF THE INVENTION

The present invention has been made in view of the problem described above, and provides a voltage-current conversion circuit capable of shortening a start-up period.

According to one embodiment of the present invention, there is provided a voltage-current conversion circuit, which is configured to convert a voltage between a first power supply terminal and a second power supply terminal into a current to generate a conversion current, the voltage-current conversion circuit including: a first MOS transistor of a first conductivity type including a gate and a drain connected in common, and a source connected to the first power supply terminal; a first resistor connected between the drain of the first MOS transistor and the second power supply terminal; and a correction current generation unit including a second resistor, and configured to generate, as a correction current, through use of the second resistor, a current corresponding to a current generated when a voltage corresponding to an absolute value of a gate-source voltage of the first MOS transistor is applied to the first resistor. The voltage-current conversion circuit is configured to add the correction current to a current flowing through the first resistor, to thereby generate the conversion current.

The voltage-current conversion circuit of the present invention is configured such that the correction current generated through use of the second resistor is added to the current flowing through the first resistor, which is connected between the drain of the first MOS transistor and the second power supply terminal, to thereby enable the voltage-current conversion circuit to provide the conversion current which is determined based on a voltage between the first power supply terminal and the second power supply terminal, and a resistance value of the first resistor, without including in the conversion current a current component related to the first MOS transistor.

In this way, it is possible to achieve a configuration that is able to provide an expected conversion current without the use of an error amplifier circuit, to thereby enable a start-up period to be shortened.

DETAILED DESCRIPTION OF THE PREFERRED EMBODIMENTS

Figure 1:
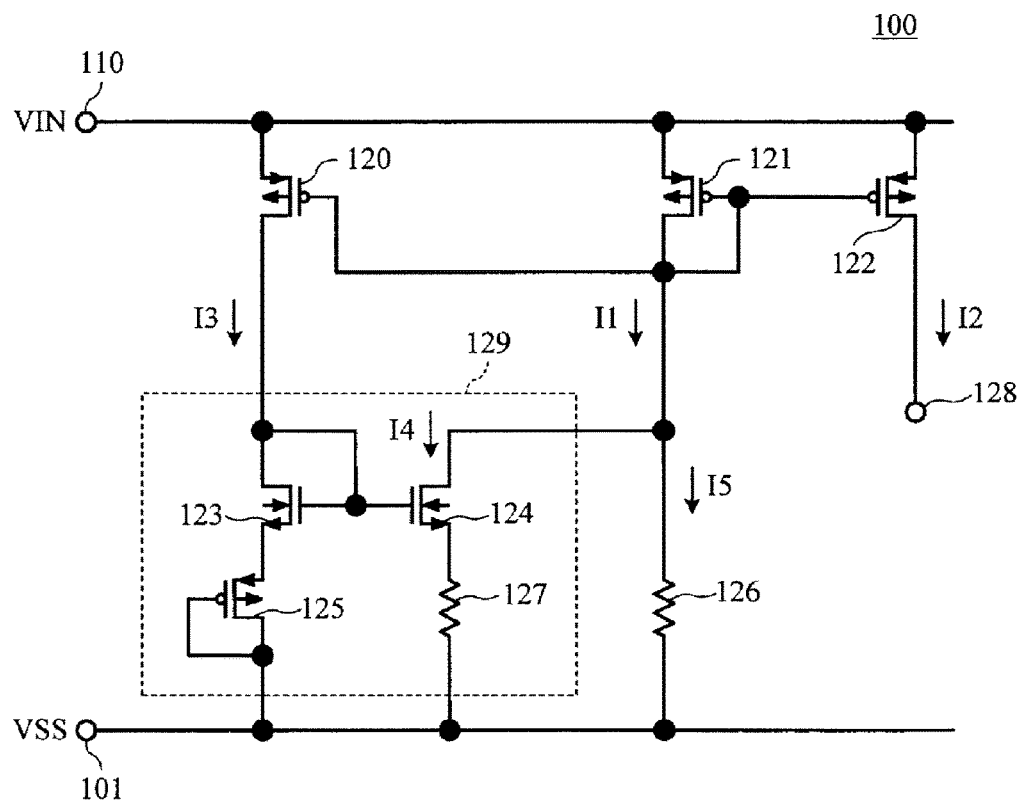
FIG. 1 is a circuit diagram for illustrating a voltage-current conversion circuit of a first embodiment of the present invention.

Now, embodiments of the present invention are described referring to the drawings.

FIG. 1 is a circuit diagram for illustrating a voltage-current conversion circuit 100 of a first embodiment of the present invention.

The voltage-current conversion circuit 100 of this embodiment includes an input terminal (also referred to as "first power supply terminal") 110, a ground terminal 101 (also referred to as "second power supply terminal"), PMOS transistors 120, 121 and 122, a resistor 126 (also referred to as "first resistor"), an output terminal 128, and a correction current generation unit 129.

The correction current generation unit 129 is formed of NMOS transistors 123 and 124, a PMOS transistor 125, and a resistor 127 (also referred to as "second resistor").

For brevity of description, it is assumed that the sizes of the PMOS transistors 120, 121, 122, and 125 are equal to each other. Similarly, it is assumed that the sizes of the NMOS transistors 123 and 124 are also equal to each other. Further, it is assumed that the sizes of the resistors 126 and 127 are equal to each other, and that resistance values thereof are represented by R.

The PMOS transistor 120 has a source connected to the input terminal 110 and a drain connected to a drain of the NMOS transistor 123 inside the correction current generation unit 129. The PMOS transistor 121 has a source connected to the input terminal 110, and a gate and a drain connected in common and to a gate of the PMOS transistor 120. The PMOS transistor 122 has a source connected to the input terminal 110, a gate connected to the gate of the PMOS transistor 120 and the gate of the PMOS transistor 121, and a drain connected to the output terminal 128. The resistor 126 has one end connected to the drain of the PMOS transistor 121, and another end connected to the ground terminal 101.

In the correction current generation unit 129, the NMOS transistor 123 has a gate and a drain connected in common, and a source connected to a source of the PMOS transistor 125. The PMOS transistor 125 has a gate and a drain connected to the ground terminal 101. The NMOS transistor 124 has a gate connected to the gate of the NMOS transistor 123, a source connected to one end of the resistor 127, and a drain connected to one end of the resistor 126 and the drain of the PMOS transistor 121. Another end of the resistor 127 is connected to the ground terminal 101.

Next, operation of the voltage-current conversion circuit 100 configured as described above is described.

When a voltage YIN is applied to the input terminal 110 (specifically, when the voltage VIN is applied between the first power supply terminal 110 and the second power supply terminal 101), a current flows through a series path of the PMOS transistor 121 and the resistor 126. A current I5 that flows through the resistor 126 is expressed by the following Expression (2), where an absolute value of a gate-source voltage of the PMOS transistor 121 is represented by |VGS|.

$$I5 = \frac{VIN - |VGS|}{R} \quad (2)$$

The PMOS transistors 120, 121 and 122 form a current mirror circuit, and hence the respective current values thereof are proportional to each other. Further, as described above, it is assumed that the sizes of the PMOS transistors 120, 121 and 122 are all equal to each other, and hence the respective current values thereof are equal to each other.

The PMOS transistor 120 supplies a current I3 to a series circuit of the NMOS transistor 123 and the PMOS transistor 125. Here, the current I3 functions as a drive current of the correction current generation unit 129.

The PMOS transistor 121 and the PMOS transistor 125 operate under the same bias state, and hence an absolute value of a gate-source voltage of the PMOS transistor 125 is equal to |VGS|. In other words, the PMOS transistor 125 operates as a replica element of the PMOS transistor 121, and a source voltage thereof is |VGS|. The gates of the NMOS transistor 123 and the NMOS transistor 124 are connected to each other, and hence those transistors operate such that a source voltage of the NMOS transistor 124 becomes substantially equal to a source voltage of the NMOS transistor 123.

The reason why the source voltages are described as being substantially equal to each other is that drain currents of the NMOS transistors 123 and 124 differ from each other, and hence, strictly speaking, the source voltages have a discrepancy. The |VGS| is approximately applied to the one end of the resistor 127, and a current I4 that flows through the resistor 127 is expressed by the following Expression (3).

$$I4 \approx \frac{|VGS|}{R} \quad (3)$$

That is, the correction current generation unit 129 outputs the current I4 proportional to |VGS|. Based on Kirchhoff's circuit laws, a current I1 that flows through the PMOS transistor 121 is expressed by the following Expression (4).

$$I1 = I4 + I5 \quad (4)$$

Through substitution of the current I4 of Expression (3) and the current I5 of Expression (2) into Expression (4), the current I1 is expressed by the following Expression (5).

$$I1 = \frac{VIN}{R} \quad (5)$$

In this way, it is understood that the input voltage VIN (specifically, the voltage between the first power supply terminal 110 and the second power supply terminal 101) is converted into a current by the resistance value R, and that the current (conversion current) I1 is generated.

Specifically, through use of the second resistor 127, the correction current generation unit 129 generates, as a correction current I4, a current corresponding to a current generated when a voltage corresponding to the absolute value of the gate-source voltage of the PMOS transistor 121 is applied to the first resistor 126. The correction current generation unit 129 then adds the correction current I4 to a current flowing through the resistor 126, to thereby generate the conversion current I1.

Further, the current I2 of the PMOS transistor 122 takes a current value equal to that of the current I1, and is output from the output terminal 128 as an output current.

Figure 2:
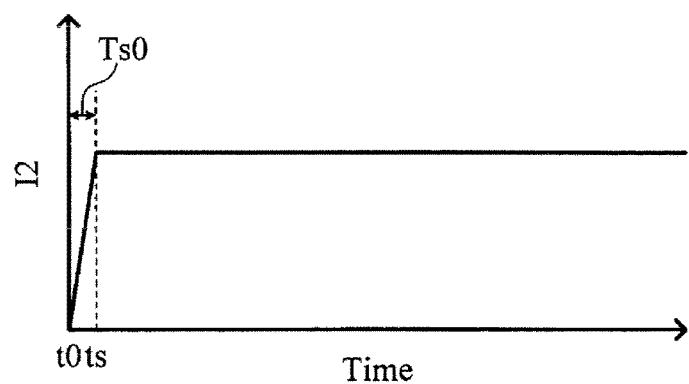
FIG. 2 is a graph for showing a waveform of an output current of the voltage-current conversion circuit of FIG. 1.

FIG. 2 is a graph for showing a waveform of the output current I2 of the voltage-current conversion circuit 100 of this embodiment.

Figure 7:
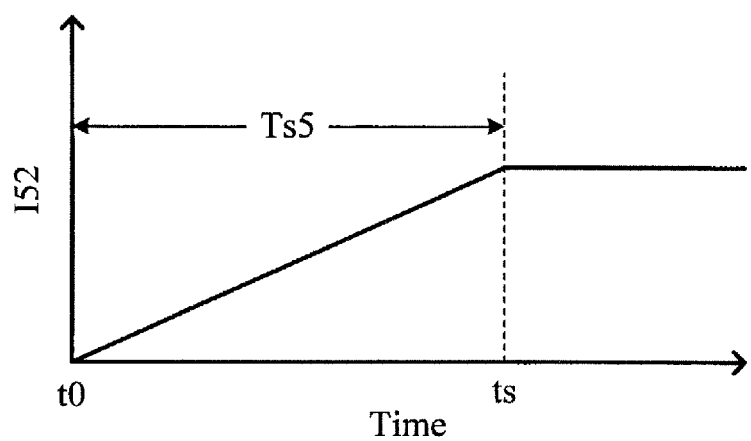
FIG. 7 is a graph for showing a waveform of an output current of the voltage-current conversion circuit of FIG. 6.

As shown in FIG. 2, a slope of the waveform from when the voltage VIN is applied at a time t0 until a time ts at which the output current I2 becomes a steady-state value is steep compared to that of a waveform of an output current I52 of the related-art voltage-current conversion circuit 500 shown in FIG. 7. Therefore, a start-up period Ts0 from the time t0 to the time ts is a period that is exceptionally shorter than the start-up period Ts5 of the related-art voltage-current conversion circuit 500. That is, the voltage-current conversion circuit 100 of this embodiment is able to start up faster than the related-art voltage-current conversion circuit 500.

In this way, the voltage-current conversion circuit 100 has a simple configuration that does not use an error amplifier circuit, with the result that a delay element, e.g., the phase compensation capacitor can be omitted and the start-up period can therefore be shortened.

Figure 3:
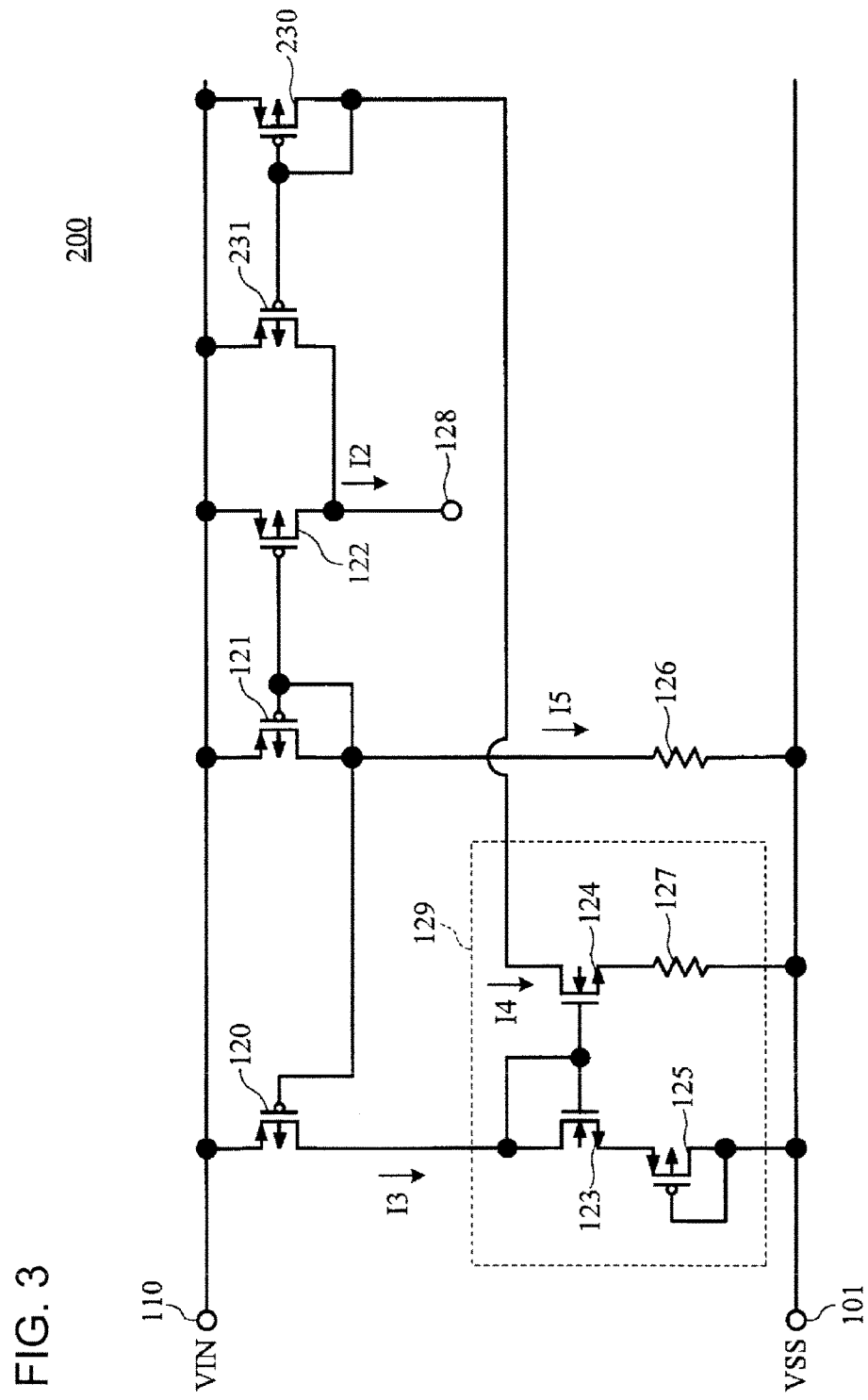
FIG. 3 is a circuit diagram for illustrating a voltage-current conversion circuit of a second embodiment of the present invention.

Next, with reference to FIG. 3, a voltage-current conversion circuit 200 of a second embodiment of the present invention is described.

The voltage-current conversion circuit 200 of this embodiment is the voltage-current conversion circuit 100 of the first embodiment with a configuration in which PMOS transistors 230 and 231 are added thereto and connection is partly changed.

Other configurations thereof are the same as those of the voltage-current conversion circuit 100 of FIG. 1, and therefore like components are denoted by like reference symbols and a duplicate description thereof is omitted.

Differences between the voltage-current conversion circuit 200 and the voltage-current conversion circuit 100 of the first embodiment are as follows.

First, a source of the PMOS transistor 231 is connected to the input terminal 110, and a drain thereof is connected to the drain of the PMOS transistor 122.

Further, a source of the PMOS transistor 230 is connected to the input terminal 110, and a gate and a drain thereof are connected to a gate of the PMOS transistor 231.

Still further, the drain of the NMOS transistor 124 is connected to a drain of the PMOS transistor 230 without being connected to the one end of the resistor 126 and the drain of the PMOS transistor 121.

Here, for brevity of description, it is assumed that the sizes of the PMOS transistors 230 and 231 are equal to each other.

Operation of the voltage-current conversion circuit 200 of this embodiment is described. Similarly to the case of connection, differences between the voltage-current conversion circuit 200 and the voltage-current conversion circuit 100 of the first embodiment are described.

The drain of the PMOS transistor 121 and the output of the correction current generation unit 129 are disconnected (not connected), and hence a drain current of the PMOS transistor 121 is determined by the current I5. The current I5 is equal to Expression (2) of the voltage-current conversion circuit 100 of the first embodiment. The output current (correction current) I4 of the correction current generation unit 129 is equal to Expression (3) of the voltage-current conversion circuit 100 of the first embodiment of the present invention.

The PMOS transistors 230 and 231 foul a current mirror circuit, and it is assumed that their respective sizes are equal to each other. Therefore, a drain current of the PMOS transistor 231 is equal to the current I4. The PMOS transistor 121 and the PMOS transistor 122 form a current mirror circuit. It is assumed that their respective sizes are equal to each other. Therefore, a drain current of the PMOS transistor 122 is equal to the current I5.

The current I2 at the output terminal 128 is expressed by the following Expression (6) in a form in which the drain current of the PMOS transistor 131 is added to the drain current of the PMOS transistor 122.

$$I2 = I4 + I5 \quad (6)$$

The current I2 is expressed by the following Expression (7), where the current I4 of Expression (3) and the current I5 of Expression (2) are substituted.

$$I2 = \frac{VIN}{R} \quad (7)$$

In this way, the input voltage is converted into a current by the resistance value R, and it is understood that the current (conversion current) I2 equal to that of the voltage-current conversion circuit 100 of the first embodiment is generated. The current I4 generated in the correction current generation unit 129 provides the same effect even when added through the intermediation of a current mirror circuit. Further, the voltage-current conversion circuit 200 has a configuration that does not use a delay element, e.g., the phase compensation capacitor, and hence can provide the same effect as the first embodiment of being able to shorten the start-up period.

Figure 4:
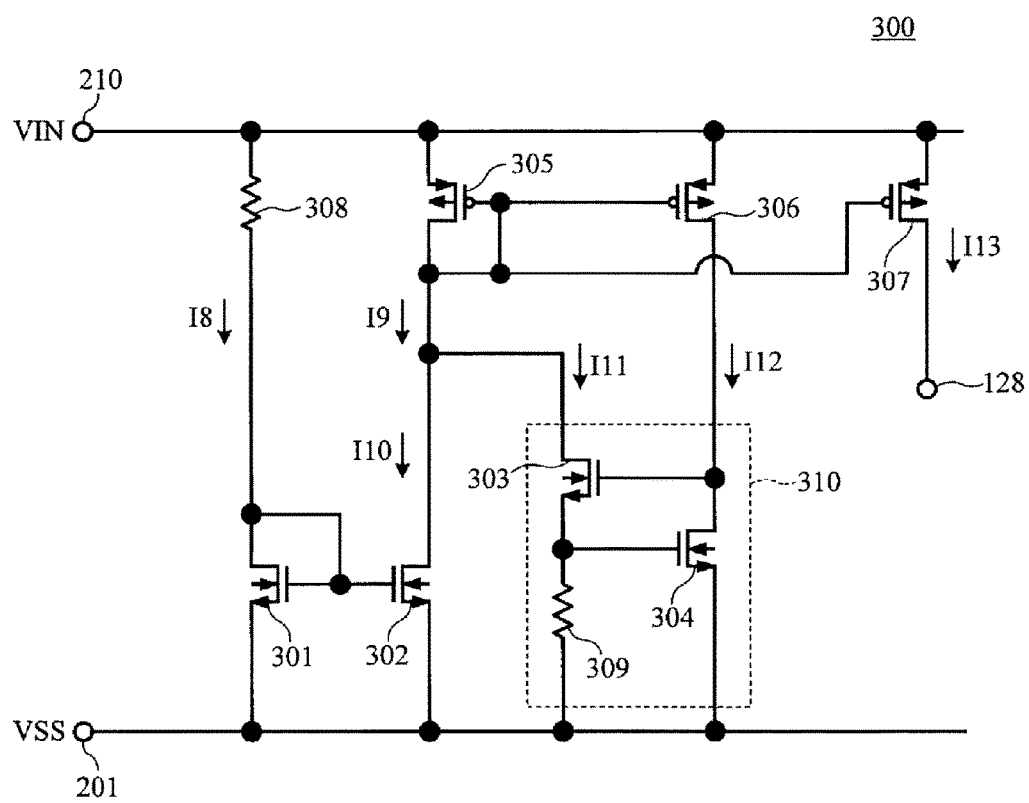
FIG. 4 is a circuit diagram for illustrating a voltage-current conversion circuit of a third embodiment of the present invention.

Next, with reference to FIG. 4, a voltage-current conversion circuit 300 of a third embodiment of the present invention is described.

The voltage-current conversion circuit 300 of this embodiment is formed of a ground terminal (also referred to as "first power supply terminal") 201, an input terminal (also referred to as "second power supply terminal") 210, NMOS transistors 301 and 302, PMOS transistors 305, 306, and 307, the output terminal 128, a resistor 308 (also referred to as "first resistor"), and a correction current generation unit 310.

The correction current generation unit 310 is formed of NMOS transistors 303 and 304, and a resistor 309 (also referred to as "second resistor").

Here, for brevity of description, it is assumed that the sizes of the PMOS transistors 305, 306, and 307 are equal to each other. Similarly, it is assumed that the sizes of the NMOS transistors 301, 302, and 304 are equal to each other. Further, it is assumed that the sizes of the resistors 308 and 309 are equal to each other, and that resistance values thereof are represented by R.

The resistor 308 has one end connected to the input terminal 210 and another end connected to a gate and a drain of the NMOS transistor 301.

The NMOS transistor 301 has a source connected to the ground terminal 201. The NMOS transistor 302 has a source connected to the ground terminal 201, a gate connected to a gate of the NMOS transistor 301, and a drain connected to a gate and a drain of the PMOS transistor 305 and a drain of the NMOS transistor 303.

The PMOS transistor 305 has a source connected to the input terminal 210. The PMOS transistor 306 has a source connected to the input terminal 210, a gate connected to the gate of the PMOS transistor 305 and a gate of the PMOS transistor 307, and a drain connected to a drain of the NMOS transistor 304 and a gate of the NMOS transistor 303.

In the correction current generation unit 310, the NMOS transistor 303 has a source connected to one end of the resistor 309 and a gate of the NMOS transistor 304. Another end of the resistor 309 is connected to the ground terminal 201. The NMOS transistor 304 has a source connected to the ground terminal 201.

The PMOS transistor 307 has a source connected to the input terminal 210, and a drain connected to the output terminal 128.

Next, operation of the voltage-current conversion circuit 300 of this embodiment is described.

When the voltage VIN is applied to the input terminal 210 (specifically, when the voltage VIN is applied between the first power supply terminal 201 and the second power supply terminal 210), a current flows through a series path of the resistor 308 and the NMOS transistor 301. A current I8 is expressed by the following Expression (8), where a gate-source voltage of the NMOS transistor 301 is represented by VGSN.

$$I8 = \frac{VIN - VGSN}{R} \tag{8}$$

The NMOS transistors 301 and 302 form a current mirror circuit, and hence current values thereof are proportional to each other. Further, as described above, it is assumed that the sizes of the NMOS transistors 301 and 302 are equal to each other, and hence the current I8 of the NMOS transistor 301 and a current I10 of the NMOS transistor 302 are equal to each other. Further, the PMOS transistors 305, 306, and 307 form a current mirror circuit, and hence current values thereof are proportional to each other. Further, as described above, it is assumed that the sizes of the PMOS transistors 305, 306, and 307 are equal to each other, and hence a current I9 of the PMOS transistor 305, a current I12 of the PMOS transistor 306, and a current I13 of the PMOS transistor 307 are equal to each other. The current I9 is the sum of the current I10 and an output current I11 of the correction current generation unit 310, and is expressed by the following Expression (9).

$$I9 = I10 + I11 \tag{9}$$

When the current I12 is supplied to the correction current generation unit 310, a gate voltage of the NMOS transistor 303 increases. This increase in voltage turns on the NMOS transistor 303, to thereby generate a drain current and increase a gate voltage of the NMOS transistor 304. When the NMOS transistor 304 turns on, a drain current is generated, and the gate voltage of the NMOS transistor 303 decreases. In this way, the NMOS transistors 303 and 304 form a negative feedback circuit, and hence the gate voltage of the NMOS transistor 304 becomes a voltage VGSN' with which the drain current of the NMOS transistor 304 becomes I12. The voltage VGSN' is applied to the resistor 309, and hence the output current (correction current) I11 of the correction current generation unit 310 is expressed by the following Expression (10).

$$I11 = \frac{VGSN'}{R} \tag{10}$$

As described above, it is assumed that the current I10 is equal to the current I8. The current I9 is expressed by the following Expression (11), where the current I9 of Expression (9) is substituted by the current I11 and the current I10.

$$I9 = \frac{VIN - VGSN}{R} + \frac{VGSN'}{R} \tag{11}$$

Further, in general, a gate-source voltage VGS of the NMOS transistor in a saturated region is expressed by the following Expression (12), where a drain current is represented by IDS, a constant is represented by K, and a threshold value is represented by VTH.

$$VGS = \sqrt{\frac{IDS}{K}} + VTH \tag{12}$$

The current I9 is expressed by the following Expression (13), where the threshold values VTH of the NMOS transistors 301 and 304 and the constants K are equal to each other, and further the current I9 of Expression (11) is substituted by the gate—source voltage in consideration of respective drain currents.

$$I9 = \frac{1}{R}\left\{VIN - \left(\sqrt{\frac{I8}{K}} + VTH\right) + \left(\sqrt{\frac{I12}{K}} + VTH\right)\right\} \tag{13}$$

The current I9 is expressed by the following Expression (14), where, in Expression (13), the currents I8 and I12 are smaller than the constant K, and the two square root terms are small enough to ignore compared to the threshold values VTH.

$$I9 \approx \frac{VIN}{R} \tag{14}$$

In this way, the input voltage VIN (specifically, the voltage between the first power supply terminal 201 and the second power supply terminal 210) is converted into a current by the resistance value R, and it is understood that the current I9 is generated. The current I13 becomes a current proportional to the current I9 due to the current mirror circuit, and is output from the output terminal 128.

Further, the voltage-current conversion circuit 300 of this embodiment includes the correction current generation unit 310 with a negative feedback circuit but has few amplification stages, which means that there is no increase in delay elements, e.g., the phase compensation capacitor, and that the effect of shortening the start-up period can be achieved similarly to the above-mentioned first and second embodiments.

Further, the reason for using approximation in the course of deriving the expressions is that a difference occurs between the drain current of the NMOS transistor 301 and the drain current of the NMOS transistor 304 in the correction current generation unit 310. It is only necessary that at least a drain current of the NMOS transistor 301 is included in the drain current of the NMOS transistor 304, and hence approximation as described above is established.

Further, the NMOS transistor 304 of this embodiment has both a function of the correction current generation unit 310 and a function of a replica element for the NMOS transistor 301.

Figure 5:
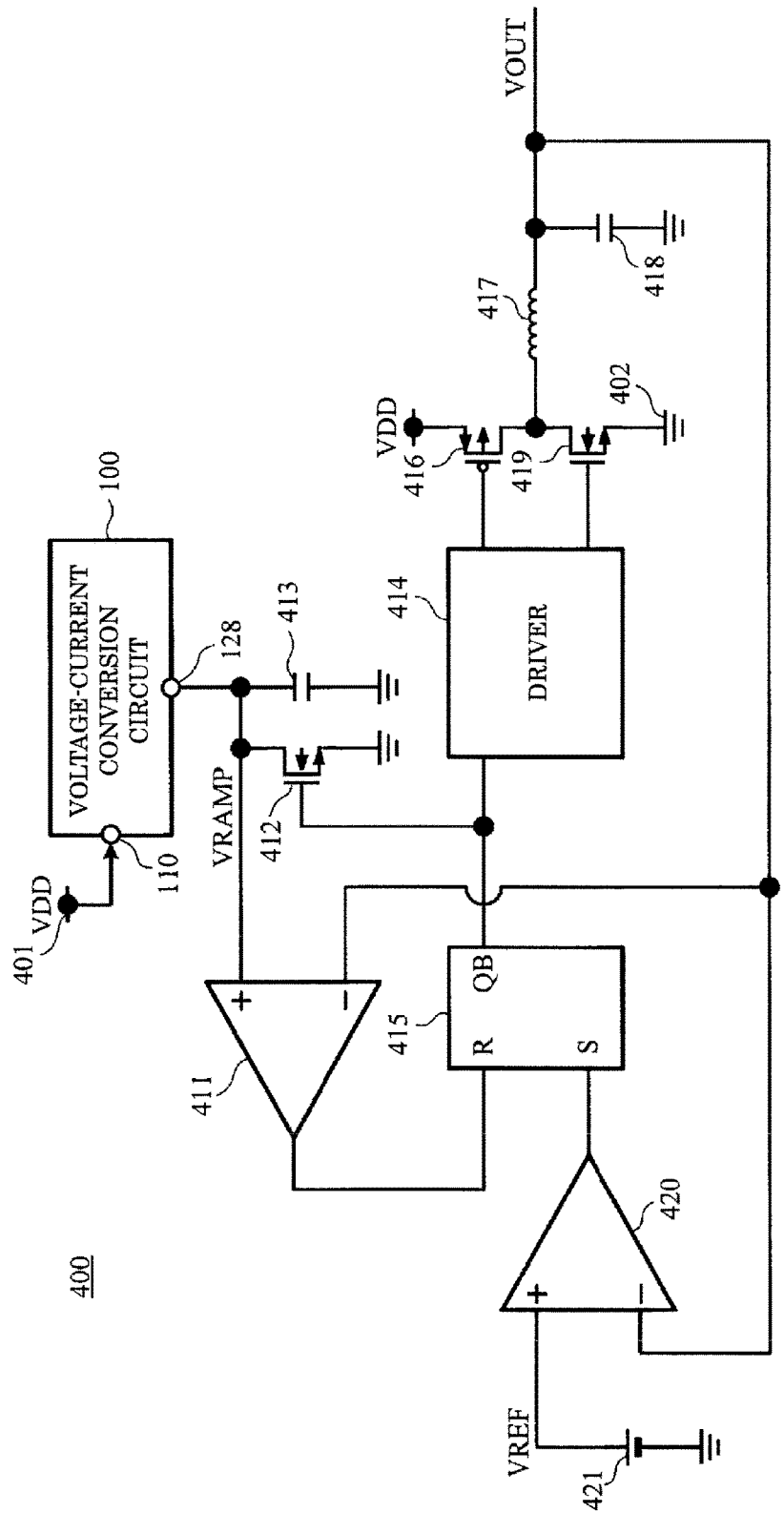
FIG. 5 is a circuit diagram for illustrating a switching regulator including the voltage-current conversion circuit of FIG. 1, FIG. 3, or FIG. 4.
Figure 6:
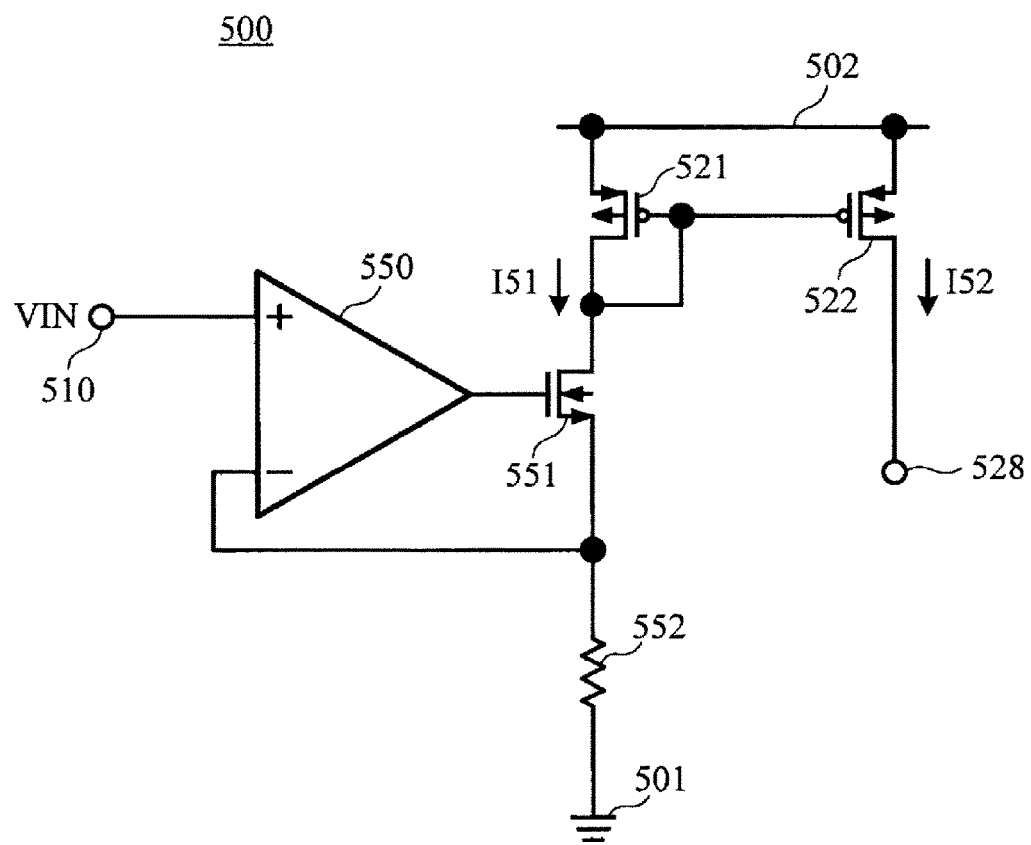
FIG. 6 is a circuit diagram for illustrating a related-art voltage-current conversion circuit.

FIG. 5 is a circuit diagram for illustrating an example in which the voltage-current conversion circuit 100 of the first embodiment of the present invention is used in a switching regulator.

A switching regulator 400 illustrated in FIG. 5 includes a power supply terminal 401, a ground terminal 402, a comparator circuit 411, an NMOS transistor 412, a capacitor 413, a driver 414, an RS flip-flop 415, a PMOS transistor 416, an NMOS transistor 419, an inductor 417, a capacitor 418, a comparator circuit 420, a reference voltage source 421, and the above-mentioned voltage-current conversion circuit 100.

In the voltage-current conversion circuit 100, the power supply terminal 401 is connected to the input terminal 110, and one end of the capacitor 413, a drain of the NMOS transistor 412, and a non-inverting input terminal of the comparator circuit 411 are connected to the output terminal 128. Another end of the capacitor 413 is connected to the ground terminal 402.

The comparator circuit 411 has an inverting input terminal connected to one end of the inductor 417, one end of the capacitor 418, and an inverting input terminal of the comparator circuit 420, and an output connected to a reset input R of the RS flip-flop 415.

The NMOS transistor 412 has a gate connected to an inverting output QB of the RS flip-flop 415 and an input of the driver 414, and a source connected to the ground terminal 402. The driver circuit 414 has a first output connected to a gate of the PMOS transistor 416, and a second output connected to a gate of the NMOS transistor 419.

The PMOS transistor 416 has a source connected to the power supply terminal 401, and a drain connected to a drain of the NMOS transistor 419 and another end of the inductor 417. Another end of the capacitor 418 is connected to the ground terminal 402. The NMOS transistor 419 has a source connected to the ground terminal 402.

The comparator circuit 420 has a non-inverting input terminal connected to one end of the reference voltage source 421, and an output connected to a set input S of the RS flip-flop 415. Another end of the reference voltage source 421 is connected to the ground terminal 402.

Operation of the switching regulator 400 is described.

The comparator circuit 420 compares a reference voltage VREF of the reference voltage source 421 and an output voltage VOUT of the switching regulator 400. When the output voltage VOUT falls below the reference voltage VREF, the comparator circuit 420 outputs HIGH and sets the RS flip-flop circuit 415.

When the RS flip-flop circuit 415 is set, the RS flip-flop circuit 415 outputs LOW from the output QB to turn off the NMOS transistor 412. At the same time, through intermediation of the driver circuit 414, the RS flip-flop circuit 415 turns on the PMOS transistor 416 and turns off the NMOS transistor 419.

In response to the NMOS transistor 412 being turned off, the capacitor 413 is charged with current output from the voltage-current conversion circuit 100. At this time, a voltage VRAMP at the one end of the capacitor 413 has a voltage waveform having a constant slope in relation to time.

Specifically, in the voltage-current conversion circuit 100, the input terminal 110 receives a power supply voltage VDD of the power supply terminal 401, and hence a current proportional to the power source voltage VDD is output from the output terminal 128. As a result, supply of current to the capacitor 413 from the voltage-current conversion circuit 410 starts in a short period of time after the power source voltage VDD has been input.

The comparator circuit 411 compares the voltage VRAMP and the voltage VOUT, and outputs HIGH when the voltage VRAMP exceeds the voltage VOUT.

The RS flip-flop 415 outputs HIGH from the output QB when HIGH is input to the reset input R. This output turns on the NMOS transistor 412 and causes the voltage VRAMP to become 0 V. Further, through intermediation of the driver circuit 414, the PMOS transistor 416 is turned off and the NMOS transistor 419 is turned on. The inductor 417 and the capacitor 418 smooth the drain voltage of the PMOS transistor 416 to generate the voltage VOUT.

In this example, there is described an example in which the voltage-current conversion circuit 100 of the first embodiment is used in a switching regulator. However, the voltage-current conversion circuit 200 or 300 of the second or third embodiment may be used in place of the voltage-current conversion circuit 100.

As described above, the voltage-current conversion circuit of the present invention can also be used as a timer circuit configured to generate an on period for a switching regulator. In such a case, there is provided an effect of shortening a start-up period from when the power source voltage is applied until when the switching regulator operates stably.

The embodiments of the present invention have been described above, but the present invention is not limited to the above-mentioned embodiments. It should be understood that various modifications can be made to the embodiments as long as the modifications do not deviate from the spirit of the present invention.

For example, in the above-mentioned embodiments, an example is described in which a MOS transistor is used as the voltage-current conversion circuit, but a bipolar transistor or the like may be used.

Further, in the above-mentioned embodiments, a circuit configuration in which the polarities of the PMOS transistor and the NMOS transistor are inverted may be used.

Further, in the above-mentioned first to third embodiments, there may be used a circuit configuration in which the correction current generated by the correction current generation unit is returned a plurality of times by the current mirror circuit and then added to a current flowing through the first resistor.

What is claimed is:

1. A voltage-current conversion circuit configured to convert a voltage between a first power supply terminal and a second power supply terminal into a conversion current, the voltage-current conversion circuit comprising:
a first MOS transistor of a first conductivity type including a gate and a drain connected in common, and a source connected to the first power supply terminal;
a first resistor having a first end directly connected to the drain of the first MOS transistor and a second end connected to the second power supply terminal; and
a correction current generation unit comprising a second resistor, and configured to generate a correction current corresponding to a current generated when a voltage corresponding to an absolute value of a gate-source voltage of the first MOS transistor is applied to the first resistor, wherein the voltage-current conversion circuit is further configured to add the correction current to a current flowing through the first resistor, to thereby generate the conversion current.

2. A voltage-current conversion circuit configured to convert a voltage between a first power supply terminal and a second power supply terminal into a conversion current, the voltage-current conversion circuit comprising:

a first MOS transistor of a first conductivity type including a gate and a drain connected in common, and a source connected to the first power supply terminal;

a first resistor connected between the drain of the first MOS transistor and the second power supply terminal; and a correction current generation unit comprising a second resistor, and configured to generate a correction current corresponding to a current generated when a voltage corresponding to an absolute value of a gate-source voltage of the first MOS transistor is applied to the first resistor, wherein the voltage-current conversion circuit is further configured to add the correction current to a current flowing through the first resistor, to thereby generate the conversion current, wherein the correction current generation unit further comprises:

a second MOS transistor of a second conductivity type including a gate and a drain connected in common;

a third MOS transistor of the first conductivity type including a gate and a drain connected to the second power supply terminal, and a source connected to a source of the second MOS transistor; and a fourth MOS transistor of the second conductivity type including a gate connected to the gate of the second MOS transistor, wherein the second resistor is connected between a source of the fourth MOS transistor and the second power supply terminal, wherein a drive current flows through a series circuit of the second MOS transistor and the third MOS transistor, and wherein the correction current flows through a series circuit of the fourth MOS transistor and the second resistor.

3. A voltage-current conversion circuit according to claim 1, wherein the correction current generation unit further comprises:

a second MOS transistor of the first conductivity type; and a third MOS transistor of the first conductivity type, wherein the second MOS transistor includes a gate connected to a source of the third MOS transistor, a drain connected to a gate of the third MOS transistor, and a source connected to the first power supply terminal, wherein the third MOS transistor includes a source connected to the first power supply terminal through intermediation of the second resistor, and wherein the correction current flows through a series circuit of the third MOS transistor and the second resistor.

4. A switching regulator, comprising the voltage-current conversion circuit of claim 1.

* * * * *